(12) United States Patent
Nagahashi

(10) Patent No.: US 8,797,502 B2
(45) Date of Patent: *Aug. 5, 2014

(54) EXPOSURE APPARATUS, EXPOSURE METHOD, AND METHOD FOR PRODUCING DEVICE WITH ELECTRICITY REMOVAL DEVICE BY ADDING ADDITIVE TO LIQUID

(75) Inventor: Yoshitomo Nagahashi, Takasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/929,503

(22) Filed: Jan. 28, 2011

(65) Prior Publication Data

US 2011/0122377 A1    May 26, 2011

Related U.S. Application Data

(60) Continuation of application No. 12/659,692, filed on Mar. 17, 2010, now abandoned, which is a continuation of application No. 11/806,404, filed on May 31, 2007, now abandoned, which is a division of application No. 11/390,370, filed on Mar. 28, 2006, now abandoned, which is a continuation of application No. PCT/JP2004/014430, filed on Sep. 24, 2004.

(30) Foreign Application Priority Data

Sep. 29, 2003 (JP) .................... 2003-336888

(51) Int. Cl.
G03B 27/52 (2006.01)

(52) U.S. Cl.
USPC .......................................... 355/30

(58) Field of Classification Search
USPC ........................................ 355/30, 53
See application file for complete search history.

(56) References Cited

U.S. PATENT DOCUMENTS

| | | |
|---|---|---|
| 3,835,355 A | 9/1974 | Tsukada |
| 4,222,776 A | 9/1980 | Tsukada et al. |
| 4,346,164 A | 8/1982 | Tabarelli et al. |
| 4,480,910 A | 11/1984 | Takanashi et al. |
| 5,480,563 A | 1/1996 | Mitsumori et al. |
| 5,503,941 A | 4/1996 | Pruyn |
| 5,610,683 A | 3/1997 | Takahashi |
| 5,715,039 A | 2/1998 | Fukuda et al. |
| 5,788,229 A | 8/1998 | Asami et al. |

(Continued)

FOREIGN PATENT DOCUMENTS

| | | |
|---|---|---|
| DE | 221 563 A1 | 4/1985 |
| DE | 224 448 A1 | 7/1985 |

(Continued)

OTHER PUBLICATIONS

Dec. 23, 2009 Office Action in U.S. Appl. No. 11/390,370.

(Continued)

*Primary Examiner* — Chia-how Michael Liu
(74) *Attorney, Agent, or Firm* — Oliff PLC

(57) ABSTRACT

A projection exposure apparatus transfers a pattern formed on a mask onto a substrate through a liquid. The projection exposure apparatus includes an optical member which projects an image of the pattern onto the substrate and an electricity removal device which removes electricity from the liquid to be supplied to a space between the optical member and a surface of the substrate by adding an additive to the liquid to suppress the liquid from being charged.

28 Claims, 6 Drawing Sheets

(56) References Cited

U.S. PATENT DOCUMENTS

| | | | |
|---|---|---|---|
| 5,825,043 A | 10/1998 | Suwa | |
| 5,969,441 A | 10/1999 | Loopstra et al. | |
| 6,208,407 B1 | 3/2001 | Loopstra | |
| 6,274,040 B1 | 8/2001 | Mitsumori et al. | |
| 6,341,007 B1 | 1/2002 | Nishi et al. | |
| 6,400,441 B1 | 6/2002 | Nishi et al. | |
| 6,535,270 B1 | 3/2003 | Murayama | |
| 6,549,269 B1 | 4/2003 | Nishi et al. | |
| 6,590,634 B1 | 7/2003 | Nishi et al. | |
| 6,857,940 B2* | 2/2005 | Akagami et al. | 451/36 |
| 7,029,832 B2* | 4/2006 | Rolland et al. | 430/322 |
| 2002/0192983 A1* | 12/2002 | Shono et al. | 438/780 |
| 2003/0021929 A1 | 1/2003 | Takahashi et al. | |
| 2003/0035087 A1 | 2/2003 | Murayama | |
| 2003/0067734 A1 | 4/2003 | Nakano | |
| 2004/0165159 A1 | 8/2004 | Lof et al. | |
| 2005/0185156 A1 | 8/2005 | Maruyama | |

FOREIGN PATENT DOCUMENTS

| | | | | |
|---|---|---|---|---|
| JP | A 58-202448 | | 11/1983 | |
| JP | A 59-19912 | | 2/1984 | |
| JP | A 62-65326 | | 3/1987 | |
| JP | A 63-157419 | | 6/1988 | |
| JP | A 04-305915 | | 10/1992 | |
| JP | A 04-305917 | | 10/1992 | |
| JP | A 05-062877 | | 3/1993 | |
| JP | A-5-243364 | | 9/1993 | |
| JP | A 06-53120 | | 2/1994 | |
| JP | 06-124873 | | 5/1994 | |
| JP | 06-168866 | | 6/1994 | |
| JP | A 06-188169 | | 7/1994 | |
| JP | A 07-220990 | | 8/1995 | |
| JP | A 08-316125 | | 11/1996 | |
| JP | 09-115873 | * | 2/1997 | H01L 21/306 |
| JP | 09-115873 | * | 5/1997 | H01L 21/306 |
| JP | A-09-283401 | | 10/1997 | |
| JP | A 10-163099 | | 6/1998 | |
| JP | A 10-214783 | | 8/1998 | |
| JP | 10-303114 | * | 11/1998 | H01L 21/027 |
| JP | A 10-303114 | | 11/1998 | |
| JP | A 10-340846 | | 12/1998 | |
| JP | A 11-135400 | | 5/1999 | |
| JP | A 11-176727 | | 7/1999 | |
| JP | A 2000-058436 | | 2/2000 | |
| JP | A 2000-505958 | | 5/2000 | |
| JP | A-2003-258071 | | 9/2003 | |
| KR | 0143944 | | 8/1998 | |
| WO | WO 99/49504 A1 | | 9/1999 | |
| WO | WO 2004/019128 A2 | | 3/2004 | |

OTHER PUBLICATIONS

Feb. 28, 2007 Office Action of U.S. Appl. No. 11/390,370.
Aug. 8, 2007 Office Action of U.S. Appl. No. 11/390,370.
Apr. 2, 2008 Office Action of U.S. Appl. No. 11/390,370.
Oct. 28, 2008 Office Action of U.S. Appl. No. 11/390,370.
May 6, 2009 Office Action of U.S. Appl. No. 11/390,370.
Nov. 12, 2008 Office Action of U.S. Appl. No. 11/806,404.
Sep. 17, 2009 Office Action of U.S. Appl. No. 11/806,404.
Dec. 28, 2004 International Search Report in Application No. PCT/JP2004/014430.
Apr. 24, 2008 Supplementary European Search Report in Application No. EP 04 77 3518.
Jul. 30, 2010 Office Action in U.S. Appl. No. 11/390,370.
Jul. 28, 2010 Office Action in U.S. Appl. No. 12/382,986.
Jul. 29, 2010 Office Action in U.S. Appl. No. 12/659,692.
Mar. 15, 2011 Office Action in U.S. Appl. No. 11/390,370.
Mar. 17, 2011 Office Action in Korean Patent Application No. 2006-7006174, with translation.
Aug. 13, 2008 Office Action issued in EP Application No. 04773518.8.
Mar. 17, 2009 Office Action issued in EP Application No. 04773518.8.
Nov. 12, 2010 Communication pursuant to Article 94(3) in European Application No. 04773518.8.
Oct. 7, 2011 Office Action issued in U.S. Appl. No. 11/390,370.
Jul. 15, 2011 Office Action issued in EP Application No. 04773518.8.
May 24, 2012 Office Action issued in U.S. Appl. No. 11/390,370.
Nov. 27, 2012 Office Action issued in Korean Application No. 2012-7025278 (with English translation).
Mar. 26, 2012 Office Action issued in Korean Application No. 2006-7006174 (with English translation).
Dec. 28, 2004 Written Opinion issued in International Patent Application No. PCT/JP2004/014430 (with translation).
Jan. 31, 2013 Office Action issued in Korean Patent Application No. 10-2006-7006174 (with translation).
Mar. 15, 2013 Office Action issued in U.S. Appl. No. 11/390,370.

* cited by examiner

EXPOSURE APPARATUS, EXPOSURE METHOD, AND METHOD FOR PRODUCING DEVICE WITH ELECTRICITY REMOVAL DEVICE BY ADDING ADDITIVE TO LIQUID

CROSS-REFERENCE

This is a Continuation of U.S. patent application Ser. No. 12/659,692 filed Mar. 17, 2010, which in turn is a Continuation of U.S. patent application Ser. No. 11/806,404 filed May 31, 2007, which in turn is a Divisional of U.S. patent application Ser. No. 11/390,370 filed Mar. 28, 2006, which is a Continuation of International Application No. PCT/JP2004/014430 filed Sep. 24, 2004 claiming the conventional priority of Japanese patent Application No. 2003-336888 filed Sep. 29, 2003. The disclosure of each of these prior applications is incorporated herein by reference in its entirety.

BACKGROUND OF INVENTION

1. Field of the Invention

The present invention relates to a projection exposure method and an apparatus to be used for transferring a mask pattern onto a photosensitive substrate in the lithography step in order to produce a device including, for example, semiconductor devices, image pickup devices (for example, CCD), liquid crystal display devices, and thin film magnetic heads. In particular, the present invention relates to a projection exposure apparatus and a method using the liquid immersion method.

2. Description of the Related Art

A projection exposure apparatus is used, for example, when a semiconductor device is produced, in which an image of a pattern on a reticle as a mask is transferred to respective shot areas on a wafer (or a glass plate or the like) coated with a resist as a photosensitive substrate via a projection optical system. A reduction projection type projection exposure apparatus (stepper), which is based on the step-and-repeat system, has been hitherto frequently used as the projection exposure apparatus. However, a projection exposure apparatus, which is based on the step-and-scan system, is also widely used recently to perform the exposure by synchronously scanning the reticle and the wafer.

As for the resolution of the projection optical system provided for the projection exposure apparatus, As the exposure wavelength to be used is shorter, the resolution becomes higher, while as the numerical aperture of the projection optical system is larger, the higher the resolution becomes higher. Therefore, the exposure wavelength, which is used for the projection exposure apparatus, is shortened year by year as the integrated circuit becomes fine and minute, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, has been already practically used as well.

When the exposure is performed, the depth of focus (DOF) is also important in the same manner as the resolution. The resolution R and the depth of focus δ are represented by the following expressions respectively.

$$R = k1 \cdot \lambda / NA \quad (1)$$

$$\delta = k2 \cdot \lambda / NA^2 \quad (2)$$

In the expressions, λ represents the exposure wavelength, NA represents the numerical aperture of the projection optical system, and k1 and k2 represent the process coefficients. According to the expressions (1) and (2), the following fact is appreciated. That is, when the exposure wavelength λ is shortened and the numerical aperture NA is increased in order to enhance the resolution R, then the depth of focus δ is narrowed. Conventionally, in the case of the projection exposure apparatus, the surface of the wafer is adjusted to match the image plane of the projection optical system in the autofocus manner to perform the exposure. However, it is impossible to adjust and match the wafer surface and the image plane with no error at all. Therefore, it is desirable that the depth of focus δ is large so that no influence is exerted on the image formation performance even when any error remains to some extent. In view of the above, for example, the phase shift reticle method, the modified illumination method, and the multilayer resist method have been hitherto suggested in order to substantially increase the depth of focus as well.

As described above, in the case of the conventional projection exposure apparatus, the depth of focus is gradually decreased, as the exposure light beam has the shorter wavelength, and the numerical aperture of the projection optical system is increased. In order to respond to the further higher integration of the semiconductor integrated circuit, the investigation is also made to further shorten the exposure wavelength. If such a situation is continued as it is, then the depth of focus is excessively decreased, and it is feared that the margin may be insufficient during the exposure operation.

Accordingly, the liquid immersion method has been suggested as a method for substantially shorten the exposure wavelength and increase the depth of focus. In this method, the space between the lower surface of the projection optical system and the wafer surface is filled with a liquid such as pure water or any organic solvent so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases). A technique, which is described, for example, in International Publication No. 99/49504, is exemplified as a conventional technique concerning the projection exposure apparatus and the exposure method to which the liquid immersion method is applied.

In the liquid immersion method as described above, for example, the pure water or the organic solvent is used as the liquid with which the space between the lower surface of the projection optical system and the wafer surface is filled. Any one of the liquids, which is used in this method, has the high electric insulation. For example, the ultrapure water, which is used in the semiconductor production factory, has a specific resistance of about 15 MΩ·cm which is high. The liquid, which has the high insulation as described above, tends to be charged with the static electricity due to the friction with the piping and/or the cavitation generated in the orifice provided in the piping passage when the liquid is made to flow through the piping passage. If the liquid, which is charged with the static electricity, is used for the liquid immersion method, it has been feared that the electric discharge may be caused between the liquid and the circuit pattern having been already formed on the wafer, and the circuit pattern may be destroyed. Further, if the electric discharge is caused between the liquid and any object other than the circuit pattern, it has been feared that the electric equipment, which is arranged around the projection optical system or around the wafer, may malfunction due to the electric noise generated during the electric discharge, and the projection exposure apparatus may cause any error and/or the projection exposure apparatus may be stopped. Further, the charged liquid attracts surrounding impurities by the static electricity. Therefore, the impurities may inhibit the exposure in some cases.

SUMMARY OF THE INVENTION

The present invention has been made taking the foregoing viewpoints into consideration, an object of which is to provide a projection exposure apparatus which makes it possible to avoid the malfunction of the apparatus and the destruction of the circuit pattern caused by the charging of the liquid to be used for the liquid immersion method. Another object of the present invention is to provide a projection exposure method and a method for producing a device, in which it is possible to avoid the destruction of the circuit pattern and the malfunction of the apparatus.

According to a first aspect of the present invention, there is provided a projection exposure apparatus which transfers a pattern formed on a mask onto a substrate through a liquid; the projection exposure apparatus comprising a projection optical system which projects an image of the pattern onto the substrate; and an electricity removal unit which removes electricity from the liquid to be supplied to a space between the projection optical system and a surface of the substrate.

According to the projection exposure apparatus of the present invention, the liquid, from which the electricity has been removed, can be supplied to the space between the projection optical system and the substrate. Therefore, it is possible to prevent the circuit pattern formed on the substrate from being destroyed by the electric discharge of the static electricity. Further, it is possible to prevent the electric equipment arranged around the projection optical system and the substrate from malfunctioning due to the electric discharge of the static electricity. In this arrangement, the electricity removal unit may have an electricity-removing filter which is provided in a flow passage of a liquid supply piping for supplying the liquid to the space between the projection optical system and the surface of the substrate, and which is grounded. The electricity-removing filter may be formed of a conductive metal foam or a conductive mesh member. Accordingly, the static electricity, with which the liquid is charged, can be removed from the liquid made to pass through the electricity-removing filter. The exposure apparatus may further comprise a liquid supply unit which supplies the liquid to the space between the projection optical system and the surface of the substrate. In this arrangement, the liquid supply unit may be provided with the electricity removal unit. When the projection exposure apparatus is a step-and-repeat type projection exposure apparatus, the liquid supply unit may supply the liquid in a direction in which the substrate is subjected to stepping. On the other hand, when the projection exposure apparatus is a step-and-scan type projection exposure apparatus, the liquid supply unit may supply the liquid in a scanning direction.

According to a second aspect of the present invention, there is provided a projection exposure apparatus which transfers a pattern formed on a mask onto a substrate through a liquid; the projection exposure apparatus comprising:

a projection optical system which projects an image of the pattern onto the substrate; and an electricity removal unit which removes electricity from the liquid intervened between the projection optical system and a surface of the substrate.

In this arrangement, the electricity removal unit may have an electrode member which is provided in an optical element of the projection optical system opposed to the substrate. The projection exposure apparatus may have an electricity-removing filter which is provided in at least one of a supply port of a liquid supply piping for supplying the liquid and a recovery port of a liquid recovery piping for recovering the liquid. Accordingly, the electricity can be removed even in a state in which the space between the optical element and the substrate is filled with the liquid. Therefore, the liquid can be prevented from being charged during the exposure and/or during the movement of the substrate.

According to a third aspect of the present invention, there is provided a projection exposure method for irradiating a mask with an exposure light beam and projecting a pattern formed on the mask onto a substrate through a liquid with a projection optical system, the projection exposure method comprising:

a step of removing electricity from the liquid; and a step of supplying the liquid to a space between the projection optical system and a surface of the substrate.

Accordingly, the static electricity is removed from the liquid with which the space between the projection optical system and the surface of the substrate is filled. It is possible to avoid the malfunction of the projection exposure apparatus and the destruction of the circuit pattern which is feared to be caused by the electric discharge of the static electricity. The step of removing the electricity may be performed prior to the step of supplying the liquid. In this procedure, the liquid may be made to pass through an electricity-removing filter in the step of supplying the liquid to the space between the projection optical system and the surface of the substrate. The electricity-removing filter may be provided at an end portion of a liquid supply tube for supplying the liquid to the space between the projection optical system and the surface of the substrate. The liquid supplied to the space between the projection optical system and the surface of the substrate may be caused to make contact with a conductive member in the step of removing the electricity from the liquid.

According to a fourth aspect of the present invention, there is provided a method for producing a device, comprising a lithography step, wherein the projection exposure apparatus according to any one of the aspects described above is used to perform exposure in the lithography step.

Accordingly, it is possible to avoid the destruction of the circuit pattern which is feared to be caused by the electric discharge of the static electricity. Therefore, the yield of the device to be produced is improved, and it is possible to avoid the malfunction of the projection exposure apparatus which would be otherwise caused by the electric discharge of the static electricity. Therefore, it is possible to maintain the high processing ability.

DESCRIPTION OF THE PREFERRED EMBODIMENTS OF THE INVENTION

An exemplary preferred embodiment of the present invention will be explained below with reference to FIGS. 1 to 3 by way of example. In this embodiment, the present invention is applied to a projection exposure apparatus based on the step-and-repeat system.

First Embodiment

Figure 1:
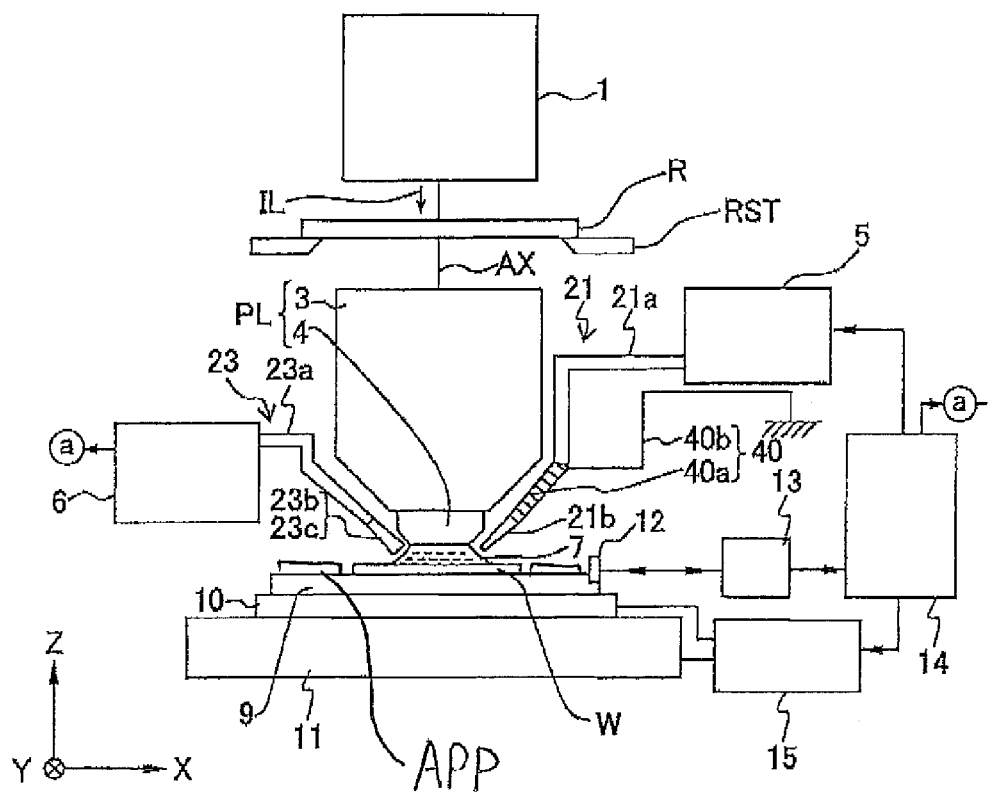
FIG. 1 shows a schematic arrangement illustrating a projection exposure apparatus to be used in a first embodiment of the present invention.

FIG. 1 shows a schematic arrangement of the projection exposure apparatus of this embodiment. With reference to FIG. 1, a pattern formed on a reticle R is illuminated with an exposure light beam IL composed of an ultraviolet pulse light beam having a wavelength of 193 nm radiated from an illumination optical system 1 which includes, for example, an ArF excimer laser light source as an exposure light source, an optical integrator (homogenizer), a field diaphragm, and a condenser lens. The pattern on the reticle R is reduced and projected onto an exposure area on a wafer W coated with a photoresist at a predetermined projection magnification β (β is, for example, ¼ or ⅕) via a projection optical system PL which is telecentric on the both sides (or on one side on the side of the wafer W). Those appropriately usable as the exposure light beam IL include, for example, the KrF excimer laser beam (wavelength: 248 nm), the $F_2$ laser beam (wavelength: 157 nm), and the i-ray (wavelength: 365 nm) of the mercury lamp. The description will be made below assuming that the Z axis extends in parallel to the optical axis AX of the projection optical system PL, the Y axis extends perpendicularly to the sheet surface of FIG. 1 in the plane perpendicular to the Z axis, and the X axis extends in parallel to the sheet surface of FIG. 1.

The reticle R is held on a reticle stage RST. A mechanism, which finely moves the reticle R in the X direction, the Y direction, and the direction of rotation, is incorporated into the reticle stage RST. The two-dimensional position and the angle of rotation of the reticle stage RST are measured in real-time by a laser interferometer (not shown). A main control system 14 positions the reticle R on the basis of an obtained measured value.

On the other hand, the wafer W is fixed on a Z stage 9 which controls the angle of inclination and the focus position (position in the Z direction) of the wafer W by the aid of a wafer holder (not shown). A conductive coating is applied to the wafer holder in order to prevent the wafer from being charged. The wafer holder is grounded by the aid of an unillustrated ground wire. The Z stage 9 is fixed on an XY stage 10 which is movable along the XY plane that is substantially parallel to the image plane of the projection optical system PL. The XY stage 10 is placed on a base 11. The Z stage 9 controls the angle of inclination and the focus position (position in the Z direction) of the wafer W so that the surface of the wafer W is adjusted to match the image plane of the projection optical system PL in the auto-focus manner and the auto-leveling manner. The XY stage 10 positions the wafer W in the X direction and the Y direction. The two-dimensional position and the angle of rotation of the Z stage 9 (wafer W) are measured in real-time as the position of a movement mirror 12 by a laser interferometer 13. Control information is fed from the main control system 14 to a wafer stage-driving system 15 on the basis of an obtained result of the measurement, on the basis of which the wafer stage-driving system 15 controls the operation of the Z stage 9 and the XY stage 10. During the exposure, the operation, in which each of shot areas on the wafer W is successively step-moved to the exposure position and exposed with the image of the pattern of the reticle R, is repeated in the step-and-repeat manner.

In this embodiment, the liquid immersion method is applied in order that the exposure wavelength is substantially shortened to improve the resolution, and the depth of focus is substantially increased. Therefore, the space between the surface of the wafer W and the end surface (lower surface) of a lens 4 of the projection optical system PL opposed to the wafer W is filled with a predetermined liquid 7 at least during the period in which image of the pattern of the reticle R is being transferred onto the wafer W. The projection optical system PL includes a barrel 3 for accommodating the other optical system and the lens 4 thereof. The projection optical system PL is constructed such that the liquid 7 makes contact with only the lens 4. Accordingly, the barrel 3 formed of metal is prevented from any corrosion or the like.

The projection optical system PL includes a plurality of optical elements including the lens 4, and the lens 4 is attached detachably (exchangeably) to the lowermost portion of the barrel 3. In this embodiment, the optical element which is disposed most closely to the wafer W and which is opposed to the wafer W, i.e., the optical element which makes contact with the liquid 7 is the lens. However, the optical element is not limited to the lens. The optical element may be an optical plate (for example, parallel flat plate or plane parallel plate) which is usable to adjust the optical characteristics of the projection optical system PL including, for example, the aberration (for example, spherical aberration and comatic aberration). On the other hand, the surface of the optical element to make contact with the liquid 7 is dirtied, for example, due to the adhesion of scattered particles generated from the resist by being irradiated with the exposure light beam or any impurity in the liquid 7. Therefore, it is necessary to periodically exchange the optical element. However, when the optical element to make contact with the liquid 7 is the lens, then the cost is expensive for the exchange part, and a long period of time is required for the exchange. As a result, the maintenance cost (running cost) is increased, and the throughput is lowered. Accordingly, the optical element, which makes contact with the liquid 7, may be, for example, a plane parallel plate which is cheaper than the lens 4. In this arrangement, it is enough that the plane parallel plate is merely exchanged immediately before supplying the liquid 7 even when any substance (for example, any silicon-based organic matter), which deteriorates, for example, the transmittance of the projection optical system PL, the illuminance of the exposure light beam on the wafer W, and the uniformity of the illuminance distribution, is adhered to the plane parallel plate, for example, during the transport, the assembling, and/or the adjustment of the projection exposure apparatus. An advantage is also obtained such that the exchange cost is lowered as compared with the case in which the optical element to make contact with the liquid 7 is the lens.

When the optical element, which is disposed most closely to the wafer W and which is opposed to the wafer W, is the optical plate, it is necessary that the space between the optical plate and an optical element (lens 4) disposed second most closely to the wafer W with respect to the optical element is also filled with the liquid 7. Accordingly, the effect of the liquid immersion method can be sufficiently obtained such that the resolution is improved and the depth of focus is substantially increased. In this arrangement, a liquid supply piping and a liquid recovery piping, which effect liquid communication with respect to the space between the optical plate and the lens 4, may be connected to the side wall of the projection optical system.

In this embodiment, for example, pure water is used as the liquid 7. Pure water is advantageous in that pure water is available in a large amount with ease, for example, in the semiconductor production factory, and pure water exerts no harmful influence, for example, on the optical lens and the photoresist on the wafer W. Further, pure water exerts no harmful influence on the environment, and the content of impurity is extremely low. Therefore, it is also expected to obtain the function to wash the surface of the wafer W and the surface of the lens 4. On the other hand, in the case of pure water, the specific resistance is high, and the electric insulation is high. Therefore, pure water has such a property that pure water tends to be charged with the static electricity, for example, due the friction generated when pure water flows through a resin piping as an insulator and the cavitation generated at an orifice portion.

It is approved that the refractive index n of pure water (water) with respect to the exposure light beam having a wavelength of about 193 nm is approximately 1.44, when pure water is used as the liquid 7. Therefore, the wavelength of 193 nm of the ArF exciter laser beam is shortened on the wafer W by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

The liquid 7 is supplied onto the wafer W via a predetermined liquid supply piping 21 in a temperature-controlled state by a liquid supply unit 5 including, for example, a tank for the liquid, a pressurizing pump, and a temperature control unit 51. The liquid 7 is recovered from the surface of the wafer W via a predetermined liquid recovery piping 23 by a liquid recovery unit 6 including, for example, a tank for the liquid and a suction pump. The temperature of the liquid 7 is set, for example, approximately identically with the temperature in the chamber in which the projection exposure apparatus of this embodiment is accommodated. The liquid supply piping 21 is principally constructed of a supply tube 21a and a supply port 21b. One end of the supply tube 21a is connected to the liquid supply unit 5, and the other end is connected to the supply port 21b. The supply port 21b has an end portion which is formed to be thin. The supply ports 21b, 22b are arranged to interpose the end portion of the lens 4 of the projection optical system PL in the X direction (see FIG. 2). An electricity removal unit 40, which removes the electricity from the liquid 7, is provided for the liquid supply piping 21. The electricity removal unit 40 is principally constructed of an electricity-removing filter 40a and a ground wire 40b. The electricity-removing filter 40a, which is provided in the flow passage of the supply tube 21a, is grounded via the ground wire. The electricity removal unit 40 will be described in detail later on. On the other hand, the liquid recovery piping 23 is principally constructed of a recovery tube 23a and recovery ports 23b, 23c. One end of the recovery tube 23a is connected to the liquid recovery unit 6, and the other end is branched into two portions which are connected to the recovery ports 23b, 23c (see FIG. 2). Further, one set of supply port 22b and recovery ports 24b, 24c, which are arranged at positions obtained by rotating those of one set of supply port 21a and recovery ports 23b, 23c by approximately 180°, are also disposed. Furthermore, two sets of supply ports and recovery ports, which are disposed to interpose the end portion of the lens 4 in the Y axis direction, are arranged as well (see FIG. 3).

Figure 2:
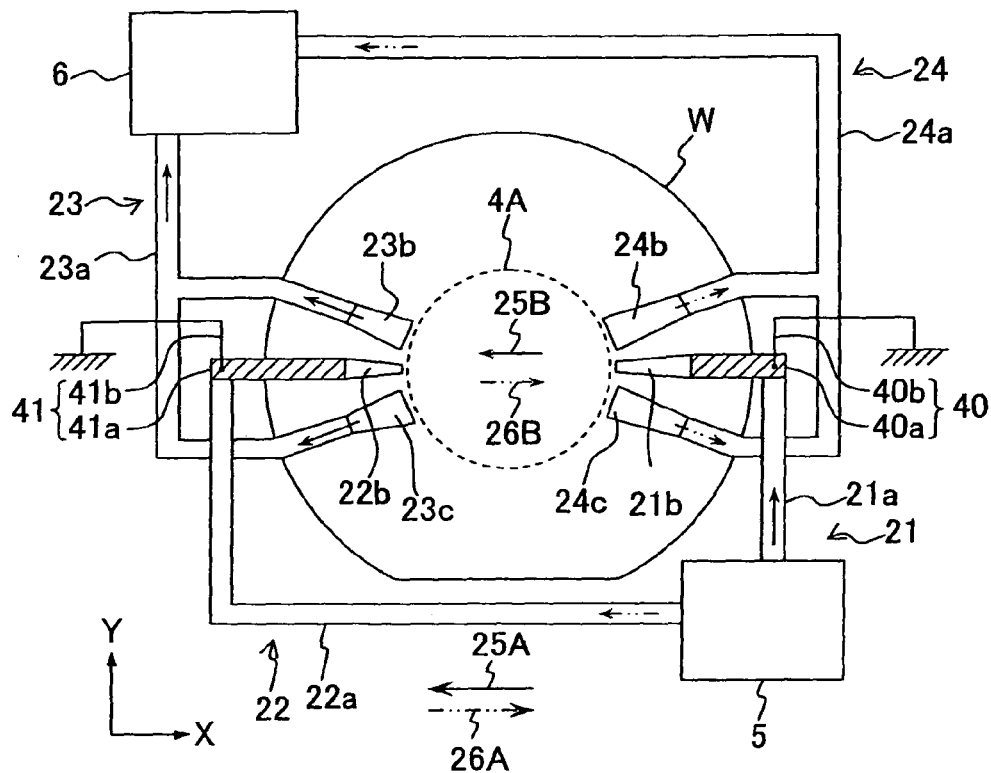
FIG. 2 shows an arrangement of supply ports, recovery ports, and electricity removal units in the X direction in the first embodiment of the present invention.

FIG. 2 shows the positional relationship among the end portion 4A of the lens 4 of the projection optical system PL shown in FIG. 1, the wafer W, and the two sets of the supply ports and the recovery ports to interpose the end portion 4A in the X direction. With reference to FIG. 2, the supply port 21b is arranged on the side in the +X direction of the end portion 4A, and the recovery ports 23b, 23c are arranged on the side in the −X direction respectively. Each of the recovery ports 23b, 23c is arranged in an open sector form with respect to the axis which passes through the center of the end portion 4A and which is parallel to the X axis. Another set of the supply port 22b and the recovery ports 24b, 24c are arranged at positions obtained by rotating those of the set of the supply port 21b and the recovery ports 23b, 23c by approximately 180°. The supply port 22b is connected to the liquid supply unit 5 via the supply tube 22a. The recovery ports 24b, 24c are connected to the liquid recovery unit 6 via the recovery tube 24a. The liquid supply piping 22 is principally constructed of the supply tube 22a and the supply port 22b. The liquid recovery piping 24 is principally constructed of the recovery tube 24a and the recovery ports 24b, 24c.

The electricity removal units 40, 41 are provided for the liquid supply pipings 21, 22 respectively. Each of the electricity removal units 40, 41 is principally constructed of the electricity-removing filter 40a, 41a formed of a conductive metal foam, and the ground wire 40b, 41b. The electricity-removing filter 40a, 41a is provided in the flow passage of the supply tube 21a, 22a, and the electricity-removing filter 40a, 41a is grounded via the ground wire 40b, 41b. Each of the electricity-removing filters 40a, 41a is formed of the conductive metal foam including, for example, porous copper and aluminum and so on. When the liquid 7 is made to pass through the metal foam, then the static electricity, with which the liquid 7 has been charged, is recovered by the electricity-removing filter 40a, 41a, and the static electricity is discharged to the ground by the aid of the ground wire 40b, 41b. That is, the electricity can be removed from the liquid 7 by the electricity-removing filter 40a, 41a. In this arrangement, it is desirable that the electricity-removing filter 40a, 41a is provided as closely as possible to the supply port 21b, 22b, for the following reason. That is, it is intended to prevent the liquid 7 from being charged again after the liquid 7 passes through the electricity-removing filter 40a, 41a and is supplied onto the wafer W.

Figure 3:
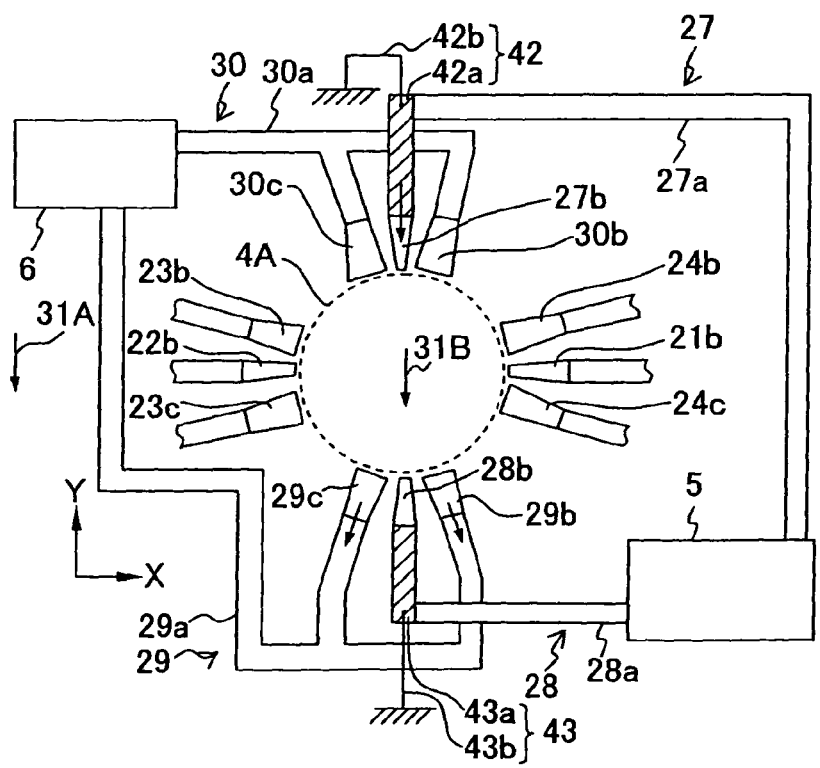
FIG. 3 shows an arrangement of supply ports, recovery ports, and electricity removal units in the X direction and the Y direction in the first embodiment of the present invention.

FIG. 3 shows the positional relationship among the end portion 4A of the lens 4 of the projection optical system PL shown in FIG. 1 and the two sets of the supply ports and the recovery ports to interpose the end portion 4A in the Y direction. With reference to FIG. 3, the supply port 27b is arranged on the side in the +Y direction of the end portion 4A. The supply port 27b is connected to the liquid supply unit 5 via the supply tube 27a. In this arrangement, the liquid supply piping 27 is principally constructed of the supply tube 27a and the supply port 27b. On the other hand, the recovery ports 29b, 29c are arranged on the side in the −Y direction of the end portion 4A respectively. The recovery ports 29b, 29c are connected to the liquid recovery unit 6 via the recovery tube 29a. In this arrangement, the liquid recovery piping 29 is principally constructed of the recovery tube 29a and the recovery ports 29b, 29c. Another set of the supply port 28b and the recovery ports 30b, 30c are arranged at positions obtained by rotating those of the set of the supply port 27b and the recovery ports 29b, 29c by approximately 180°. The supply port 28b is connected to the liquid supply unit 5 via the supply tube 28a. The recovery ports 30b, 30c are connected to the liquid recovery unit 6 via the recovery tube 30a. These components construct main portions of the liquid supply piping 28 and the liquid recovery piping 29 respectively. The liquid supply unit 5 supplies the temperature-controlled liquid to the space between the wafer W and the end portion 4A of the lens 4 via at least one of the liquid supply pipings 21, 22, 27, 28. The liquid recovery unit 6 recovers the liquid via at least one of the liquid recovery pipings 23, 24, 29, 30. Electricity removal units 42, 43 are also provided for the liquid supply pipings 27, 28 which supply the liquid 7 in the Y direction. Specifically, the electricity-removing filters 42a, 43a are provided for the supply tubes 27a, 28a, and the electricity-removing filters 42a, 43a are grounded via the ground wires 42b, 43b, respectively. Accordingly, the electricity can be removed even when the liquid 7 is supplied in the Y direction.

Next, an explanation will be made about the operation of the projection exposure apparatus of this embodiment. The main control system 14 (see FIG. 1) stores an exposure recipe corresponding to a semiconductor device to be produced. Necessary operations are instructed to the respective sections, for example, on the basis of the best focus position and the exposure energy recorded in the exposure recipe. An unillustrated wafer transport system transports the wafer W onto the unillustrated wafer holder fixed on the Z stage 9, on the basis of the instruction supplied from the main control system 14. The reticle stage RST positions the reticle R, and the wafer stage-driving system 15 positions the wafer W by using the Z stage 9 and the XY stage 10. Concurrently with the positioning operation, the liquid supply unit 5 supplies the liquid 7 to the liquid supply pipings 21, 22, 27, 28 on the basis of the instruction from the main control system 14. The electricity is removed from the liquid 7 by the electricity-removing filters 40a, 41a, 42a, 43a provided for the liquid supply pipings 21, 22, 27, 28. The liquid 7, from which the electricity has been removed, is supplied to the space between the wafer W and the lens 4 of the projection optical system PL to fill the space between the lens 4 and the wafer W therewith. After the reticle R and the wafer W are positioned at the predetermined positions, and the space between the lens 4 and the wafer W is filled with the liquid 7, the illumination optical system 1 radiates the illumination light beam IL to expose the first shot area on the wafer W with image of the pattern of the reticle R. When the exposure is completed for the first shot area, the wafer W is step-moved by the XY stage 10 to the position at which the next shot area is to be exposed. The liquid supply unit 5 and the liquid recovery unit 6 supply and recover the liquid 7 simultaneously during the movement of the wafer W by appropriately selecting the liquid supply piping and the suitable liquid recovery piping depending on the direction of the step movement. The liquid 7 is retained in the space between the lens 4 and the wafer W. The step movement is thereafter repeated (step-and-repeat) to perform the exposure for all of the shot areas on the wafer W. As described above, in the case of the projection exposure apparatus of this embodiment, the liquid 7 is subjected to the removal of electricity before the liquid 7 is supplied to the space between the lens 4 and the wafer W. Therefore, it is possible to avoid the occurrence of the inconvenience which would be otherwise caused, for example, such that the electric discharge is caused on the wafer W by the charged liquid 7, the pattern formed on the wafer W is destroyed, and/or the peripheral equipment malfunctions.

An explanation will be made in further detail below about the method for supplying and recovering the liquid 7 during the step movement of the wafer W. With reference to FIG. 2, when the wafer W is step-moved in the direction of the arrow 25A indicated by the solid line (−X direction), the liquid supply unit 5 supplies the liquid 7 to the space between the wafer W and the end portion 4A of the lens 4 via the liquid supply piping 21. In this situation, the liquid 7 is gradually charged with the static electricity by the friction with the interior of the liquid supply unit 5 and/or the piping as the liquid 7 flows through the supply tube 21a and/or by the cavitation generated at the orifice provided in the piping passage. As a result, liquid 7 is in the charged state. The liquid 7, which is in the charged state, passes through the electricity-removing filter 40a provided in the supply tube 21a of the liquid supply piping 21. The electricity-removing filter 40a is formed of the conductive metal foam, which is grounded (earthed) by the ground wire 40b. Accordingly, the static electricity is recovered and discharged to the ground when the liquid 7 passes through the electricity-removing filter 40a. Thus, the electricity is removed from the liquid 7. Therefore, the liquid 7, which is not charged, is supplied to the space between the wafer W and the lens 4.

The liquid recovery unit 6 recovers the liquid 7 from the surface of the wafer W by the aid of the liquid recovery piping 23. In this situation, the liquid 7 flows on the wafer W in the direction of the arrow 25B (−X direction). The space between the wafer W and the lens 4 is stably filled with the liquid 7.

On the other hand, when the wafer W is step-moved in the direction of the arrow 26A indicated by the two-dot chain line (+X direction), then the liquid supply unit 5 supplies the liquid 7 to the space between the wafer W and the end portion 4A of the lens 4 by using the liquid supply piping 22, and the liquid recovery unit 6 recovers the liquid 7 by using the liquid recovery piping 24. Prior to the supply of the liquid 7, the electricity is removed from the liquid 7 by the electricity-removing filter 41a provided in the supply tube 22a of the liquid supply piping 22. The supplied liquid 7 flows on the wafer W in the direction of the arrow 26B (+X direction). The space between the wafer W and the lens 4 is filled with the liquid 7.

As described above, in the case of the projection exposure apparatus of this embodiment, the liquid 7, from which the electricity has been removed by the electricity-removing filters 40a, 41a, is supplied to the space between the wafer W and the lens 4. Therefore, it is possible to avoid the destruction of the circuit pattern formed on the wafer W caused by the electric discharge of the static electricity and the malfunction of the apparatus arranged around the Z stage 9 and the XY stage 10 and the projection optical system PL.

The two sets of the supply ports and the recovery ports, which are mutually inverted in the X direction, are provided, and the electricity-removing filters are provided in the flow passages of the respective liquid supply pipings. Therefore, even when the wafer W is moved in any one of the +X direction and the −X direction, the space between the wafer W and the lens 4 can be stably and continuously filled with the liquid 7 from which the electricity has been removed. Even when any foreign matter (including scattered particles from the resist) is adhered onto the wafer W, the foreign matter can flowed out with the liquid 7, because the liquid 7 flows on the wafer W. No surrounding impurity is attracted by the static electricity, because the electricity has been removed from the liquid 7 by the electricity removal units 40, 41. Further, the liquid 7 is adjusted to have the predetermined temperature by the liquid supply unit 5. Therefore, the temperature is adjusted for the surface of the wafer W, and it is possible to avoid the decrease in the overlay accuracy or the like which would be otherwise caused by the thermal expansion of the wafer due to the heat generated during the exposure. Therefore, even when any time difference arises between the alignment and the exposure as in the alignment based on the EGA (Enhanced Global Alignment) system, it is possible to avoid the decrease in the overlay accuracy which would be otherwise caused by the thermal expansion of the wafer. In the case of the projection exposure apparatus of this embodiment, the liquid 7 flows in the same direction as the direction of the movement of the wafer W. Therefore, it is possible to recover the liquid which has absorbed the foreign matter and the heat, without allowing the liquid to stay on the exposure area disposed just below the end portion 4A of the lens 4.

When the wafer W is step-moved in the Y direction, the liquid 7 is supplied and recovered in the Y direction. That is, when the wafer is step-moved in the direction of the arrow 31A indicated by the solid line in FIG. 3 (−Y direction), then the liquid supply unit 5 supplies the liquid via the supply tube 27a and the supply port 27b, and the liquid recovery unit 6 recovers the liquid by using the recovery tube 29a and the recovery ports 29b, 29c. The liquid flows in the direction of the arrow 31B (−Y direction) on the exposure area disposed just below the end portion 4A of the lens 4. When the wafer is step-moved in the +Y direction, the liquid is supplied and recovered by using the supply tube 28a, the supply port 28b, the recovery tube 30a, and the recovery ports 30b, 30c. The liquid flows in the +Y direction on the exposure area disposed just below the end portion 4A. Accordingly, even when the wafer W is moved in any one of the +Y direction and the −Y direction, the space between the wafer W and the end portion 4A of the lens 4 can be filled with the liquid 7, in the same manner as in the case in which the wafer W is moved in the X direction. Also in this case, the electricity is removed from the liquid 7 by the electricity removal units 42, 43 provided for the liquid supply pipings 27, 28.

The supply and recovery ports are not limited only to the supply port and the recovery port for supplying and recovering the liquid 7 in the X direction and the Y direction. For example, a supply port and a recovery port for supplying and recovering the liquid 7 in any oblique direction may be provided, and the electricity-removing filter may be provided for the liquid supply piping thereof.

The electricity removal unit 40, 41, 42, 43 of the projection exposure apparatus of this embodiment is constructed such that the electricity-removing filter 40a, 41a, 42a, 43a is provided for the supply tube 21a, 22a, 27a, 28a, respectively. However, it is allowable that the electricity-removing filter 40a, 41a, 42a, 43a is provided at any position provided that the position is included in the flow passage of the liquid supply piping 21, 22, 27, 28. However, if the route to be followed after the liquid passes through the electricity-removing filter is long, it is feared that the liquid 7 may be charged again. Therefore, it is desirable that the electricity-removing filter is provided on the downstream side of the liquid supply piping as much as possible. For example, the electricity-removing filter can be provided at the supply port 21b, 22b, 27b, 28b. In this arrangement, the supply port and the electricity-removing filter may be constructed as an integrated body. It is also allowable that a plurality of electricity-removing filters are provided in the flow passage of the liquid supply piping.

In this embodiment, the electricity-removing filter is formed of the metal foam. However, there is no limitation to the metal foam provided that the electricity-removing filter is constructed so that the conductive material and the liquid 7 make contact with each other. For example, the electricity-removing filter may be composed of a conductive metal mesh. Alternatively, at least a part of the supply tube 21a, 22a, 27a, 28a may be formed of a conductive material. When the supply tube made of the conductive material or the metal mesh is used for the electricity-removing filter, then the electricity-removing filter can be constructed simply as compared with the case in which the metal foam is used, and it is possible to decrease the tube passage resistance when the liquid 7 flows. Alternatively, the inner wall of the liquid supply piping (as well as the liquid recovery piping) may be subjected to the coating with an antistatic agent.

Second Embodiment

Next, a second embodiment of the present invention will be explained with reference to FIG. 4. In the description of the second embodiment of the present invention, the constitutive components, which are the same as or equivalent to those of the first embodiment, are designated by the same reference numerals, any explanation of which will be omitted.

Figure 4:
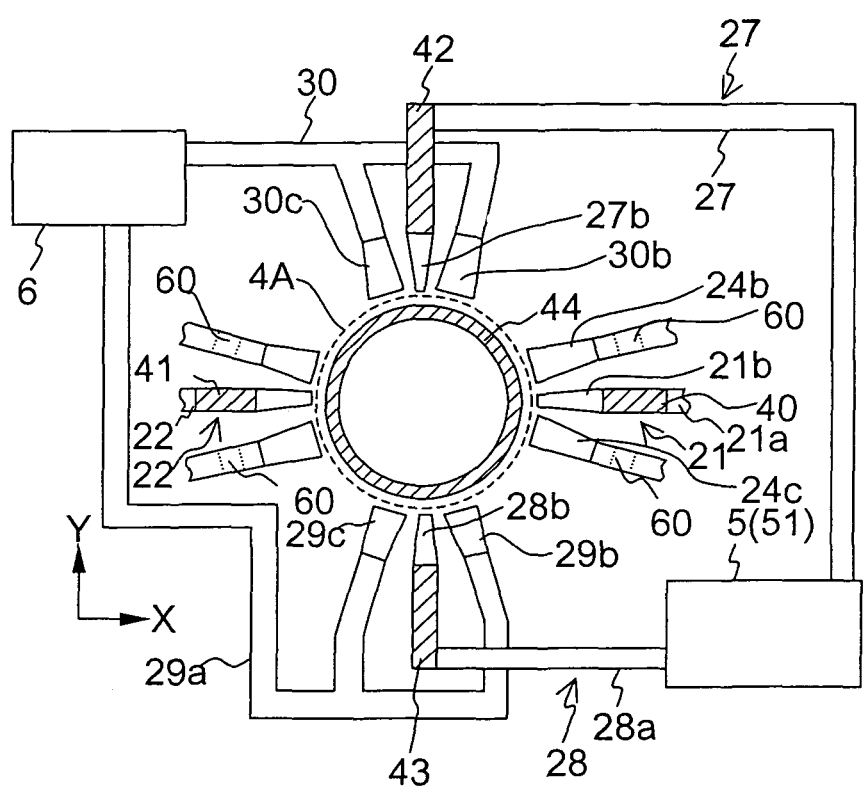
FIG. 4 shows an arrangement of supply ports, recovery ports, and electricity removal units in a second embodiment of the present invention.

FIG. 4 shows the positional relationship among the end portion 4A of the lens 4 of the projection optical system PL shown in FIG. 1, and each two sets, i.e., four sets in total of the supply ports and the recovery ports which interpose the end portion 4A in the X direction and the Y direction. As shown in FIG. 4, an electrode member 44 is formed on the lower surface of the lens 4 in this embodiment. The electrode member 44 is a conductor which is formed by means of the vapor deposition on a part of the surface of the lens 4. The electrode member 44 is formed in a circular zonal form at the position at which the exposure light beam is not inhibited and the electrode member 44 makes contact with the liquid 7 when the space between the lens 4 and the wafer W is filled with the liquid 7, outside the exposure range of the end portion 4A of the lens 4 in this embodiment. That is, the conductor is formed as an annular member which is coaxial with the optical axis of the lens 4. The electrode member 44 is grounded (earthed) via an unillustrated ground wire. The electricity-removing filters 40a, 41a, 42a, 43a are provided for the supply tubes 21a, 22a, 27a, 28a of the liquid supply pipings 21, 22, 27, 28 respectively. The electricity-removing filters 40a, 41a, 42a, 43a are grounded (earthed) via the unillustrated ground wires. Accordingly, the liquid 7, from which the electricity has been removed, can be supplied to the space between the lens 4 and the wafer W by using the electricity-removing filters 40a, 41a, 42a, 43a. Further, the electricity can be removed from the liquid 7 which is in a state of being retained between the lens 4 and the wafer W, by using the electrode member 44. In other words, the electricity is removed by the electricity-removing filters 40a, 41a, 42a, 43a before the supply of the liquid 7, and the electricity is removed by the electrode member 44 after the supply of the liquid 7. Further, according to this arrangement, the electricity can be removed from the liquid 7 during the exposure as well. Therefore, the electricity can be removed quickly even when the liquid 7 is charged during the exposure. Further, the electricity can be removed quickly even when the liquid 7 is charged during the alignment and/or during the step movement. In this embodiment, the electricity-removing filters 40a, 41a, 42a, 43a are provided for the liquid supply pipings 21, 22, 27, 28, and the electrode member 44 is provided at the end portion 4A of the lens 4. However, it is also possible to provide only the electrode member 44 without providing any electricity-removing filter. Also in this arrangement, the electricity can be removed from the liquid 7 in the state of being retained between the lens 4 and the wafer W.

It is also allowable that an auxiliary plane plate APP, which has the same height as that of the surface of the wafer W, is arranged around the wafer W on the Z stage 9, and the electrode member is provided on the auxiliary plane plate. Accordingly, the liquid 7 can be retained between the Z stage 9 and the lens 4 even on the auxiliary plane plate disposed outside the wafer W. Therefore, the electricity can be removed from the liquid 7 by moving the electrode member provided on the Z stage 9 to the position below the lens 4. When the liquid 7 is present on the wafer W, the electricity cannot be removed from the liquid 7 disposed on the wafer W even when the wafer W is grounded via the wafer holder, because the resist, with which the wafer W is coated, is usually an insulator. However, when a wafer W, which is coated with a conductive resist, is used, the electricity can be removed, because the liquid 7 is grounded via the conductive resist, the wafer W, and the wafer holder.

Third Embodiment

Next, a third embodiment of the present invention will be explained with reference to FIG. 5. In this embodiment, the present invention is applied to a case of the exposure with a projection exposure apparatus based on the step-and-scan system, i.e., the so-called scanning type projection exposure apparatus. Also in this embodiment, the space between the lens 4 and the surface of the wafer W is filled with the liquid 7 during the scanning exposure by applying the liquid immersion method. The supply and the recovery of the liquid 7 are performed by a liquid supply unit 5 and a liquid recovery unit 6 respectively. The electricity is removed from the liquid 7 by electricity removal units 40, 41 provided for liquid supply pipings 21, 22. In the description of this embodiment, the constitutive components, which are the same as or equivalent to those of the first and second embodiments, are designated by the same reference numerals, any explanation of which will be omitted.

Figure 5:
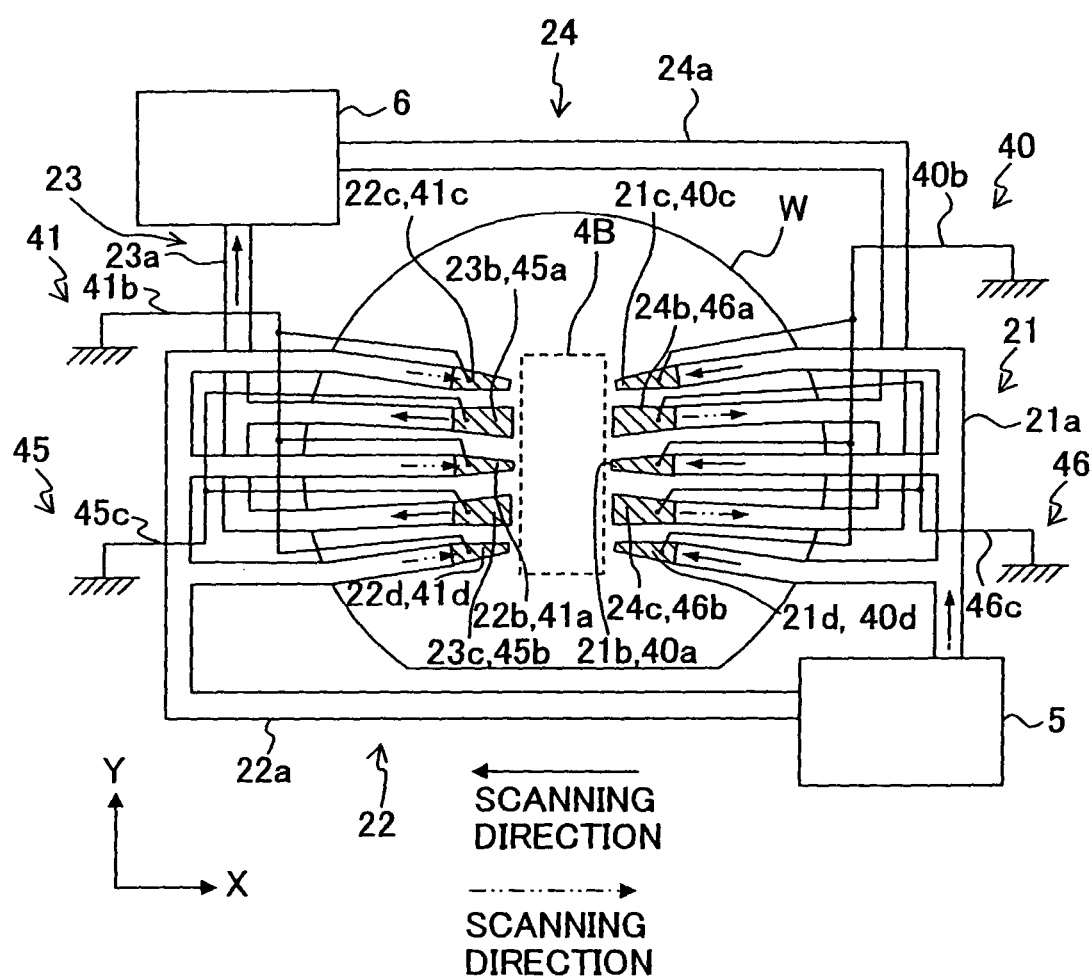
FIG. 5 shows an arrangement of supply ports, recovery ports, and electricity removal units in a third embodiment of the present invention.

FIG. 5 shows the positional relationship among an end portion 4B of a lens 4 of a projection optical system PL and supply ports and recovery ports for supplying and recovering the liquid 7 in the X direction. In the case of the scanning type projection exposure apparatus of this embodiment, the lens 4, which is disposed at the lowermost end of the projection optical system PL, has the end portion 4B which is subjected to the cutting to have a rectangular shape that is long in the Y direction (non-scanning direction) and has a necessary portion for the scanning exposure. The three supply ports 21b to 21d are arranged on the side in the +X direction, and the two recovery ports 23b, 23c are arranged on the side in the −X direction so that the end portion 4B of the lens 4 of the projection optical system PL is interposed between the supply ports 21b to 21d and the recovery ports 23b, 23c.

The supply ports 21b to 21d are connected to the liquid supply unit 5 via a supply tube 21a. The recovery ports 23b, 23c are connected to the liquid recovery unit 6 via a recovery tube 23a. The supply ports 22b to 22d and the recovery ports 24b, 24c are arranged at positions obtained by rotating those of the supply ports 21b to 21d and the recovery ports 23b, 23c by approximately 180°. The supply ports 21b to 21d and the recovery ports 24b, 24c are arranged alternately in the Y direction. The supply ports 22b to 22c and the recovery ports 23b, 23c are arranged alternately in the Y direction. The supply ports 22b to 22d are connected to the liquid supply unit 5 via a supply tube 22a. The recovery ports 24b, 24c are connected to the liquid recovery unit 6 via a recovery tube 24a.

The electricity removal unit 40 is provided for the liquid supply piping 21. The electricity removal unit 40 is principally constructed of electricity-removing filters 40a, 40c, 40d which are provided at the supply ports 21b to 21d as the flow passages of the liquid supply piping 21, and a ground wire 40b which is connected to the electricity-removing filters.

Similarly, the electricity removal unit 41, which is provided for the liquid supply piping 22, is principally constructed of electricity-removing filters 41a, 41c, 41d which are provided at the supply ports 22b to 22d as the flow passages of the liquid supply piping 22, and a ground wire 41b which is connected to the electricity-removing filters. Each of the electricity-removing filters 40a, 40c, 40d, 41a, 41c, 41d is formed of a conductive metal foam, which is grounded via the ground wire 40b, 41b.

In the projection exposure apparatus of this embodiment, electricity removal units 45, 46 are also provided for the liquid recovery pipings 23, 24. Specifically, electricity-removing filters 45a, 45b, 46a, 46b are provided at the recovery ports 23b, 23c, 24b, 24c, respectively as the flow passages of the liquid recovery pipings 23, 24, which are grounded via lead wires 45c, 46c, respectively.

Next, an explanation will be made about the exposure operation of the scanning type exposure apparatus of this embodiment. During the scanning exposure, a part of image of the pattern of the reticle is projected onto the rectangular exposure area disposed just below the end portion 4B. The reticle (not shown) is moved at a velocity V in the −X direction (or in the +X direction) with respect to the projection optical system PL, in synchronization with which the wafer W is moved at a velocity β·V (β represents the projection magnification) in the +X direction (or in the −X direction) by the aid of the XY stage 10. After the completion of the exposure for one shot area, the next shot area is moved to the scanning start position in accordance with the stepping of the wafer W. The exposure is successively performed for the respective shot areas thereafter in the step-and-scan manner.

When the scanning exposure is performed while moving the wafer W in the scanning direction (−X direction) indicated by the solid line arrow, then the liquid 7 is supplied by using the supply tube 21a, the supply ports 21b to 21d while removing the electricity from the liquid by using the electricity-removing filters 40a, 40b, 40d, and the liquid 7 is recovered by using the recovery tube 23a, the recovery ports 23b, 23c, while removing the electricity from the liquid by using the electricity-removing filters 45a, 45b. The liquid 7 is made to flow in the −X direction so that the space between the lens 4 and the wafer W is filled therewith. On the other hand, when the scanning exposure is performed while moving the wafer W in the direction (+X direction) indicated by the two-dot chain line arrow, then the liquid 7 is supplied by using the supply tube 22a, the supply ports 22b to 22d, while removing the electricity from the liquid by using the electricity-removing filters 41a, 41b, 41d, and the liquid 7 is recovered by using the recovery tube 24a, the recovery ports 24b, 24c, while removing the electricity from the liquid by using the electricity-removing filters 46a, 46b. The liquid 7 is made to flow in the +X direction so that the space between the lens 4 and the wafer W is filled therewith.

Figure 6:
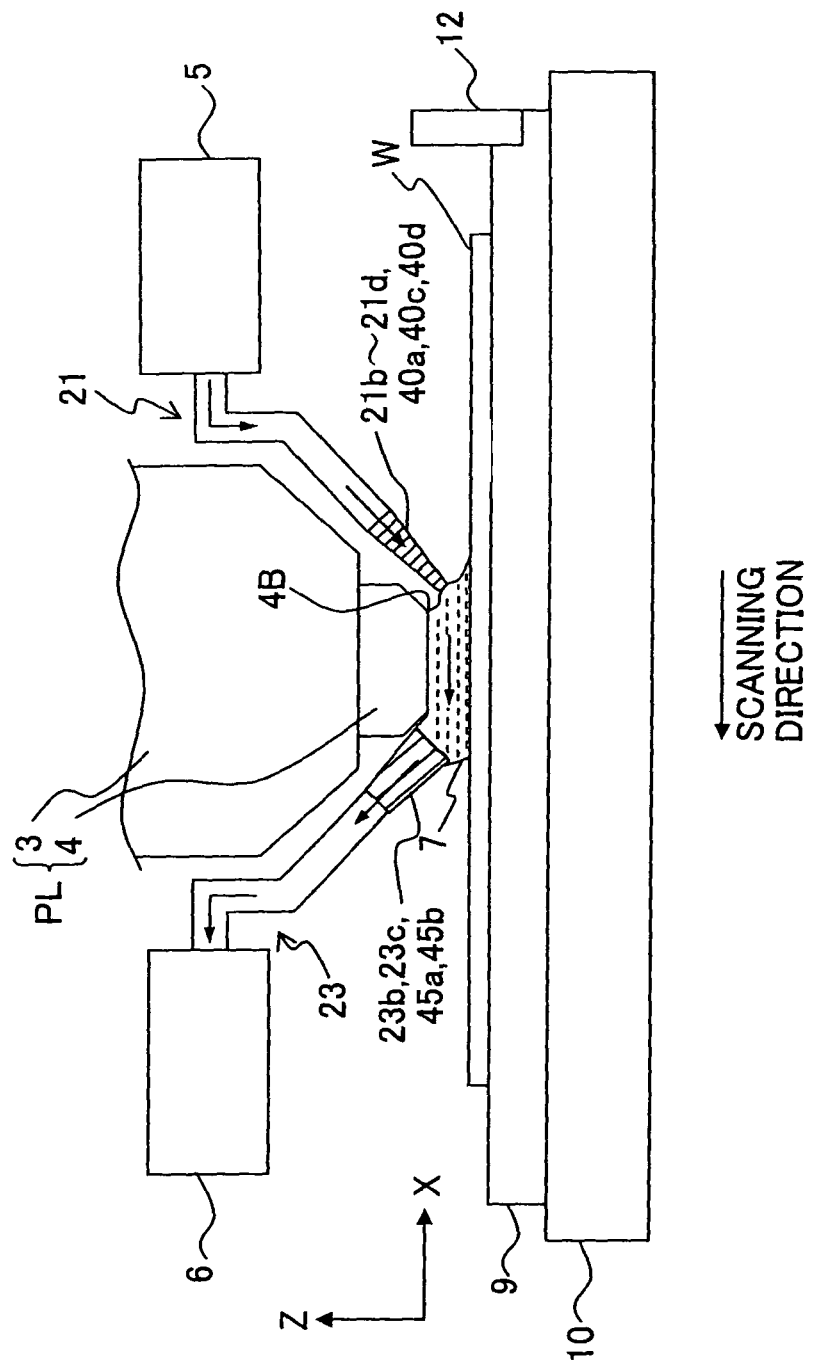
FIG. 6 shows the operation to be performed during the scanning exposure in the third embodiment of the present invention.

FIG. 6 shows a state of the supply ports 21b to 21d, the recovery ports 23b, 23c, and the liquid 7 during the scanning exposure. In FIG. 6, the wafer W is moved in the −X direction indicated by the solid line arrow. In the scanning exposure apparatus of this embodiment, the liquid is supplied and recovered also during the scanning exposure as described above. Therefore, at least one of the supply ports 21b to 21d and the recovery ports 23b, 23c always makes contact with the liquid 7 with which the space between the lens 4 and the wafer W is filled.

As described above, according to the scanning type exposure apparatus of this embodiment, the liquid 7, which exists between the lens 4 and the wafer W, makes contact with at least any one of the supply ports 21b to 21d and the recovery ports 23b, 23c during the scanning exposure. Therefore, the electricity can be removed in the state in which the space between the lens 4 and the wafer W is filled with the liquid 7, by the electricity-removing filter 40a, 40c, 40d provided for the supply port 21b to 21d or the electricity-removing filter 45a, 45b provided for the recovery port 23b, 23c. According to this arrangement, the electricity can be always removed from the liquid 7 during the scanning exposure. Therefore, it is possible to prevent the liquid 7 from being charged during the exposure. It is possible to avoid the inconvenience including, for example, the destruction of the circuit pattern formed on the wafer W caused by the electric discharge of the static electricity, and the malfunction of the equipment arranged around the projection optical system PL, the Z stage 9, and the XY stage 10.

This embodiment is constructed such that the electricity-removing filters are provided for the liquid supply piping and the liquid recovery piping. However, it is also allowable that an electrode member is formed at the end portion 4B of the lens 4 to remove the electricity from the liquid 7 in the state in which the space between the lens 4 and the wafer W is filled with the liquid 7, in the same manner as in the second embodiment.

The projection exposure apparatus of this embodiment is constructed such that the electricity-removing filters are provided for both of the supply ports 21b to 21d, 22b to 22d and the recovery ports 23b, 23c, 24b, 24c. However, it is also allowable that the electricity-removing filter may be provided for any one of them. In this embodiment, the two recovery ports are provided for one liquid recovery piping each, and the electricity-removing filter is provided for each of them. However, it is also allowable that the electricity-removing filter is provided for only any one of the two recovery ports. Even in this arrangement, it is possible to reliably remove the electricity from the liquid 7. Further, it is also allowable that at least one of the supply ports and the recovery ports may be made of a conductive material, and may not have any electricity-removing filters. Even in this simple arrangement, at least one of the supply ports and the recovery ports work as a part of the electricity removable unit because of its electric conductivity, and it is possible to remove the electricity from the liquid 7.

The numbers and the shapes of the supply ports and the recovery ports are not specifically limited. For example, it is also allowable that the liquid 7 is supplied and recovered with two sets of the supply ports and the recovery ports for the long side of the end portion 4B. In this arrangement, the supply ports and the recovery ports may be arranged while being aligned vertically in order to successfully supply and recover the liquid 7 in any one of the directions of the +X direction and the −X direction. When the wafer W is step-moved in the Y direction, it is desirable that the liquid supply piping and the liquid recovery piping for supplying and recovering the liquid 7 in the Y direction are provided, in the same manner as in the first embodiment. Also in this case, the electricity-removing filter as described above may be provided for the liquid supply piping and/or the liquid recovery piping. Accordingly, it is possible to avoid the charging of the liquid caused upon the liquid supply when the step movement is performed, and it is possible to start the scanning exposure for the next shot area by the aid of the liquid from which the electricity has been removed.

In the respective embodiments described above, the liquid, which is to be used as the liquid 7, is not specifically limited to pure water. It is possible to use liquids (for example, cedar oil) which have the transmittance with respect to the exposure light beam, which have the refractive index as high as possible, and which are stable against the photoresist coated on the surface of the wafer and the projection optical system.

A fluorine-based inert liquid, which is chemically stable, i.e., which has a high transmittance with respect to the exposure light beam, and which is a safe liquid, may be used as the liquid 7. For example, it is possible to use Fluorinert (trade name of 3M of the United States) as the fluorine-based inert liquid. In particular, when the $F_2$ laser beam is used as the exposure light beam, a fluorine-based liquid such as fluorine-based oil and perfluoropolyether (PFPE), through which the $F_2$ laser beam is transmissive, may be used as the liquid. The fluorine-based inert liquid as described above is also excellent in the cooling efficiency. In view of the object of the present invention, it is also allowable that an arbitrary additive is added in order to prevent the liquid from being charged. For example, when pure water is used as the liquid 7, it is possible to suppress pure water from being charged, by injecting carbon dioxide into pure water.

The liquid 7, which is recovered in each of the embodiments described above, may be reused. In this case, it is desirable that a filter 60, which removes any impurity from the recovered liquid 7, is provided, for example, for the liquid recovery unit or the recovery tube.

It is enough that the range, in which the liquid 7 is allowed to flow, is set to cover the entire area of the projection area (irradiation area of the exposure light beam) of image of the pattern of the reticle, and it is enough that the size thereof is arbitrary. However, it is desirable that the range is made to be as small as possible while making the range to be slightly larger than the exposure area as in each of the embodiments described above, in view of the control of, for example, the flow velocity and the flow rate. It is difficult to recover all of the supplied liquid by the recovery port. Therefore, for example, it is desirable that a partition wall is formed to surround the wafer, and a piping for recovering the liquid contained inside the partition wall is further provided in order that the liquid does not overflow from the surface of the Z stage.

In each of the embodiments described above, the liquid 7 is allowed to flow in the direction of the movement of the wafer W (XY stage 10). However, it is not necessarily indispensable that the direction, in which the liquid 7 is allowed to flow, is coincident with the direction of the movement. That is, the direction, in which the liquid 7 is allowed to flow, may intersect the direction of the movement. For example, when the wafer W is moved in the +X direction, it is appropriate that the liquid 7 is made to flow in such a direction that the velocity component of the liquid 7 in the −X direction is zero or not more than a predetermined allowable value. Accordingly, when the wafer is exposed in the step-and-repeat manner or the step-and-scan manner (both including the step-and-stitch manner), if the direction of the movement is frequently changed in a short period of time (for example, about several hundreds ms), then the direction, in which the fluid is made to flow, can be controlled while following the change, and it is possible to fill the space between the projection optical system and the wafer with the liquid. In order to improve the throughput in the scanning type projection exposure apparatus based on the step-and-scan system, the movement of the XY stage is controlled so that both of the velocity components of the XY stage in the scanning direction and the non-scanning direction are not zero during the movement of the wafer between the shot areas, i.e., the stepping of the XY stage (movement in the non-scanning direction) is started during the deceleration of the XY stage (before the velocity component in the scanning direction becomes zero) after the completion of the scanning exposure for one shot area, and that the acceleration of the XY stage is started before the completion of the stepping (for example, during the deceleration of the XY stage before the velocity component in the non-scanning direction becomes zero) in order to perform the scanning exposure for the next shot area. Even in such a situation, the direction, in which the liquid is made to flow, can be controlled depending on the direction of the movement of the wafer, and the space between the projection optical system and the wafer can be filled with the liquid.

When the optical element of the projection optical system PL, which is disposed most closely to the wafer W, is the optical plate, it is desirable that the electricity is also removed from the liquid 7 to be supplied to the space between the optical plate and the optical element (lens 4) disposed second most closely to the wafer W with respect to the above.

When the liquid immersion method is used as described above, the numerical aperture NA of the projection optical system PL is 0.9 to 1.3 in some cases. When the numerical aperture NA of the projection optical system PL is large as described above, it is desirable to use the polarized illumination, because with the random polarized light which has been hitherto used as the exposure light beam, the image formation performance is deteriorated due to the polarization effect in some cases. In this case, it is appropriate that the linear polarized illumination, which is adjusted to the longitudinal direction of the line pattern of the line-and-space pattern of the reticle R, is effected so that the diffracted light of the S-polarized light component (component in the polarization direction along with the longitudinal direction of the line pattern) is dominantly allowed to outgo from the pattern of the reticle R. When the space between the projection optical system PL and the resist coated on the surface of the wafer W is filled with the liquid, the diffracted light of the S-polarized light component, which contributes to the improvement in the contrast, has the high transmittance on the resist surface, as compared with the case in which the space between the projection optical system PL and the resist coated on the surface of the wafer W is filled with the air (gas). Therefore, it is possible to obtain the high image formation performance even when the numerical aperture NA of the projection optical system PL exceeds 1.0. Further, it is more effective to appropriately combine, for example, the phase shift mask and the oblique incidence illumination method (dipole illumination method) as disclosed in Japanese Patent Application Laid-open No. 6-188169.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited to only the linear polarized illumination (S-polarized illumination) adjusted to the longitudinal direction of the line pattern of the reticle R. In particular, when the pattern of the reticle R includes not only the line pattern extending in one predetermined direction, but the pattern also includes the line patterns extending in a plurality of different directions in a mixed manner, then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well.

The present invention is also applicable to a twin-stage type exposure apparatus which is provided with two stages capable of moving independently in the XY direction while separately placing processing objective substrates such as wafers. In this case, the exposure apparatus is constructed so that the liquid immersion exposure can be performed on each of the substrate stages, wherein the electricity removal unit as explained in the foregoing embodiment may be provided for each of the stages. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

As disclosed in Japanese Patent Application Laid-open No. 11-135400, the present invention is also applicable to the projection exposure apparatus which is provided with a wafer stage that is movable while holding a processing objective substrate such as a wafer, and a measuring stage that is provided with measuring sensors for measuring various types of data in relation to the exposure, the measuring stage being movable independently from the wafer stage. In this case, the electrode member for removing the electricity may be provided on the measuring stage to remove the electricity from the liquid 7 which is retained between the measuring stage and the projection optical system PL.

The way of use of the projection exposure apparatus of this embodiment is not limited to the projection exposure apparatus for the semiconductor production. The present invention is also widely applicable, for example, to the projection exposure apparatus for the liquid crystal for exposing a rectangular glass plate with a liquid crystal display device pattern and the projection exposure apparatus for producing a thin film magnetic head.

The reticle or the mask, which is to be used for the device-producing projection exposure apparatus for producing the semiconductor element or the like, is produced, for example, by the projection exposure apparatus using the far ultraviolet light beam or the vacuum ultraviolet light beam in some cases. The projection exposure apparatuses according to the respective embodiments described above are also appropriately usable in the photolithography step of producing the reticle or the mask.

Further, it is also allowable to use the high harmonic wave obtained such that the single wavelength laser in the infrared region or the visible region, which is oscillated from a fiber laser or a DFB semiconductor laser as an illumination light beam for the exposure, is amplified with a fiber amplifier doped with, for example, erbium (Er) (or both of erbium and ytterbium (Yb)), followed by being subjected to the wavelength conversion into the ultraviolet light beam by using a nonlinear optical crystal.

The projection optical system PL may be any one of the dioptric system, the catoptric system, and the cata-dioptric system. As for the cata-dioptric system, it is possible to use an optical system in which a plurality of dioptric optical elements and two cata-dioptric optical elements (at least one of them is a concave mirror) are arranged on an optical axis extending in a straight line without being bent, as disclosed, for example, in U.S. Pat. No. 5,031,976. In the case of the projection exposure apparatus having the cata-dioptric system disclosed in this United States patent document, the optical element, which is disposed most closely to the wafer, i.e., which makes contact with the liquid, is the catoptric optical element. The contents of this U.S. Pat. No. 5,031,976 are incorporated herein by reference within a range of permission of the domestic laws and ordinances of the state designated in this international application or the state selected in this international application.

The projection exposure apparatus according to the embodiment of the present invention can be produced such that the illumination optical system and the projection optical system, which are constructed of a plurality of lenses, are incorporated into the main body of the exposure apparatus to perform the optical adjustment; the reticle stage and the wafer stage, which are constructed of a large number of mechanical parts, are attached to the main body of the exposure apparatus to connect wirings and pipings thereto, the pipings (for example, the supply tubes and the supply ports) for supplying and recovering the liquid are installed; and the overall adjustment (for example, the electric adjustment and the confirmation of the operation) is performed. It is desirable that the exposure apparatus is produced in a clean room in which, for example, the temperature and the cleanness are managed.

Figure 7:
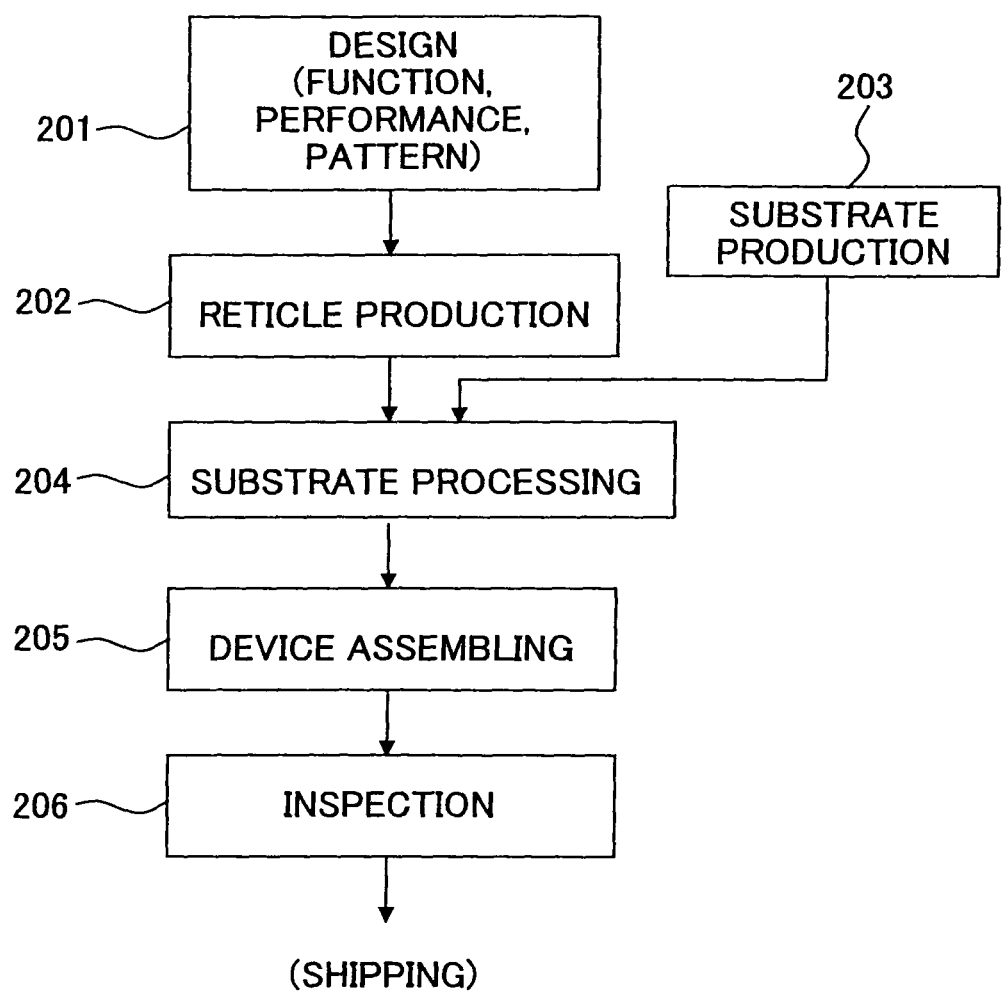
FIG. 7 shows a flow chart illustrating exemplary steps of producing a semiconductor device.

As shown in FIG. 7, the microdevice such as the semiconductor device is produced by performing, for example, a step 201 of designing the function and the performance of the microdevice, a step 202 of manufacturing a reticle (mask) based on the designing step, a step 203 of producing a substrate as a base material for the device, a substrate-processing step 204 of exposing the substrate with a pattern of the reticle by using the exposure apparatus of the embodiment described above, a step 205 of assembling the device (including a dicing step, a bonding step, and a packaging step), and an inspection step 206.

The present invention is not limited to the embodiments described above, which may be embodied in other various forms without deviating from the gist or scope of the present invention.

According to the projection exposure apparatus of the present invention, it is possible to remove the electricity from the liquid to be used for the liquid immersion method. Therefore, it is possible to avoid the malfunction of the apparatus and the destruction of the circuit pattern which would be otherwise caused by the electric discharge of the charged liquid. Further, according to the projection exposure method of the present invention, the exposure can be performed without causing the destruction of the circuit pattern and the malfunction of the apparatus, because the electricity is removed from the liquid to be used for the liquid immersion method. Further, according to the method for producing the device of the present invention, neither destruction of the circuit pattern nor malfunction of the apparatus is caused. Therefore, the yield is improved when the device is produced, and it is possible to maintain the high processing ability.

The invention claimed is:

1. An exposure apparatus which transfers a pattern formed on a mask onto a substrate through an optical member and through a liquid of a liquid immersion area, the exposure apparatus comprising:
   a movable member which is movable while the substrate is placed thereon; and
   a supply unit which has a supply port and a resin piping connected to the supply port, the supply unit supplying the liquid via the resin piping from the supply port onto a part of a surface of the substrate held by the movable member so as to form the liquid immersion area on the substrate, wherein
      an additive that suppresses the liquid from being charged is added to the liquid so that the liquid, to which the additive has been added, is supplied onto the part of the surface of the substrate,
      the liquid is pure water, and
      the liquid, to which the additive has been added, is supplied onto the part of the surface of the substrate via the supply port, and the substrate is exposed via the liquid to which the additive has been added.

2. A method for manufacturing a device including a lithography step, the method comprising:
   transferring, in the lithography step, a device pattern onto a substrate by using the exposure apparatus as defined in claim 1.

3. The exposure apparatus according to claim 1, wherein the supply port is disposed at a position which is above the substrate placed on the movable member and at which the supply port faces the surface of the substrate.

4. The exposure apparatus according to claim 3, wherein the resin piping has a flow passage for the liquid.

5. The exposure apparatus according to claim 4, wherein the resin piping has an insulating property.

6. The exposure apparatus according to claim 4, wherein the resin piping is grounded.

7. The exposure apparatus according to claim 6, wherein the resin piping has a conductive member which is grounded.

8. The exposure apparatus according to claim 1, wherein before the liquid is supplied to the liquid immersion area, the liquid is brought into contact with a conductive member which is grounded.

9. The exposure apparatus according to claim 1, wherein the additive includes carbon dioxide.

10. The exposure apparatus according to claim 1, further comprising a recovery unit which recovers the liquid of the liquid immersion area.

11. The exposure apparatus according to claim 10, further comprising a removal member which removes an impurity from the recovered liquid.

12. The exposure apparatus according to claim 1, further comprising a temperature controller which adjusts a temperature of the liquid to a predetermined temperature.

13. The exposure apparatus according to claim 12, wherein the temperature controller adjusts the temperature of the liquid to be approximately same as a temperature in the space in which the liquid immersion area is formed.

14. The exposure apparatus according to claim 1, wherein the movable member has a surrounding surface surrounding the substrate, and the substrate is placed on the movable member such that the surface of the substrate and the surrounding surface are substantially the same height.

15. The exposure apparatus according to claim 1, wherein the supply unit has a grounded conductive member arranged to remove electricity from the liquid to be supplied onto the part of the surface of the substrate via the supply port.

16. An exposure method for exposing a substrate with a pattern formed on a mask through an optical member and through a liquid of a liquid immersion area, the exposure method comprising:
   adding an additive to the liquid to suppress the liquid from being charged;
   supplying the liquid, to which the additive has been added, onto a part of a surface of the substrate held by a movable member via a supply port and a resin piping connected to the supply port so as to form the liquid immersion area on the substrate; and
   exposing the substrate via the liquid, to which the additive has been added, of the immersion area,
   wherein the liquid is pure water.

17. The exposure method according to claim 16, wherein the additive is carbon dioxide.

18. The exposure method according to claim 16, wherein an inner wall of the resin piping is subjected to a coating with an antistatic agent.

19. The exposure method according to claim 16, wherein the resin piping has an insulating property.

20. The exposure method according to claim 16, wherein the resin piping is grounded.

21. The exposure method according to claim 20, wherein the resin piping has a conductive member which is grounded.

22. The exposure method according to claim 16, wherein before the liquid is supplied to the liquid immersion area, the liquid is brought into contact with a conductive member which is grounded.

23. The exposure method according to claim 16, further comprising recovering the liquid of the liquid immersion area.

24. The exposure method according to claim 23, further comprising removing an impurity from the recovered liquid.

25. The exposure method according to claim 16, further comprising controlling a temperature of the liquid to be adjusted to a predetermined temperature.

26. The exposure method according to claim 25, wherein the controlling the temperature of the liquid includes adjusting the temperature of the liquid to be approximately same as a temperature in the space in which the liquid immersion area is formed.

27. A method for manufacturing a device including a lithography step, the method comprising:
   transferring, in the lithography step, a device pattern onto a substrate by using the exposure method as defined in claim 16.

28. The exposure method according to claim 16, wherein the movable member has a surrounding surface surrounding the substrate, and the substrate is placed on the movable member such that the surface of the substrate and the surrounding surface are substantially the same height.

* * * * *